United States Patent [19]

Brown et al.

[11] Patent Number: 5,426,266
[45] Date of Patent: Jun. 20, 1995

[54] DIE BONDING CONNECTOR AND METHOD

[75] Inventors: Candice H. Brown, Portland; Davar I. Roshanagh, Beaverton, both of Oreg.

[73] Assignee: Planar Systems, Inc., Beaverton, Oreg.

[21] Appl. No.: 149,601

[22] Filed: Nov. 8, 1993

[51] Int. Cl.⁶ ............................................. H05K 1/00
[52] U.S. Cl. ................................... 174/267; 174/261; 174/262; 361/760; 361/774; 361/777
[58] Field of Search ............... 174/250, 254, 259, 260, 174/261, 267, 256, 257; 228/179, 180.1, 180.2; 200/275, 279; 361/749, 759, 760, 767, 768, 774, 777, 779; 428/901

[56] References Cited
U.S. PATENT DOCUMENTS
5,307,559 5/1994 Long.

Primary Examiner—Leo P. Picard
Assistant Examiner—Cheryl R. Figlin
Attorney, Agent, or Firm—Chernoff, Vilhauer, McClung & Stenzel

[57] ABSTRACT

A connection for mounting an IC die directly to a substrate includes circuit runs deposited on the substrate with bond pad portions having metallization patterns forming ridges and cutout areas. Metal bumps made of gold or other highly conductive malleable material are placed atop the metallization patterns and are forced into the cutout areas between ridges as the dies are compressed onto the substrate. This locks the dies to the circuit run bond pads so as to resist thermal stress and high humidity.

6 Claims, 2 Drawing Sheets

DIE BONDING CONNECTOR AND METHOD

BACKGROUND OF THE INVENTION

The following invention relates to a connector for bonding IC dies directly to a substrate and more particularly to a connector and the method of making it which permits the direct bonding of IC dies to a substrate without the need for wire bonds.

IC dies are typically mounted on a substrate using one of two methods. When the substrate is glass, typically an IC die is placed upon a plastic mounting on the glass and a wire bond is used to connect the bond pads of the IC die to metal leads that extend across the glass substrate to the edge of the plastic mounting. The metal leads are connected by way of elastomers to the edge interconnects that lead away from the substrate. More recently, bonds called "FlipChip" interconnects have been used in which metal circuit runs which extend across a glass substrate and are connected to IC dies using a gold bump at the end of the circuit runs which mates with bond pads on the IC die. The IC die is compressed onto the gold bumps and an adhesive is then applied around the bumps. The problem with this method is that the adhesive must have an extremely low thermal expansion coefficient.

Solid metal bumps have a very limited elastic range. The preferred metals, gold, indium, or copper, have fairly low coefficients of thermal expansion. For example, the $C_{TE}$ of gold is $14.2 \times 10^{-6}$. On the other hand, adhesives typically have $C_{TE}$'s in the range of $114 \times 10^{-6}$ to $550 \times 10^6$. Thus, the adhesive expands much faster than the gold bumps as temperature rises. Gold has a Youngs Modulous of only $11.6 \times 10^{-6}$ psi. This means that the bump might be unable to elastically expand and will lift off of the substrate as the temperature is increased. Water absorption is also a problem because water can be absorbed by the adhesive causing it to swell, and the swell in turn lifts the bump off of the substrate and its interconnecting circuit run. Thus, a great deal of time and effort has been invested in the past in attempting to design an adhesive that has a low enough coefficient of thermal expansion to be used with a FlipChip mounting.

SUMMARY OF THE PRESENT INVENTION

The present invention provides an interlocking metallization pattern at the ends of the circuit runs to prevent the gold bumps from being lifted off of the substrate as a result of swelling or thermal expansion. As such, a metallic conductor is deposited on a substrate forming a circuit run. The circuit run has an end portion that serves as a bond pad with cutout areas for forming a metallization pattern of conductive ridges. Thus, a connection for the IC die mounted directly on a substrate includes a circuit run extending across the substrate terminating in a bond pad portion where the bond pad portion includes a metallization pattern containing ridges where the spacing between adjacent ridges is smaller than the width of a metallic malleable conductive bump interconnecting the bond pad on the IC die with the bond pad at the end of the circuit run. The bond pads of the IC dies are lined up with the metallic bumps and compressive force is applied. This forces part of the malleable metal bumps into the voids between the ridges of the circuit run bond pads. Thus, the interconnecting metal bump interlocks with the circuit run bond pads and will not pull out and away from the substrate under high heat or high humidity conditions.

According to the method of the invention circuit runs are deposited on a substrate in a predefined pattern and patterned bond pads are formed at the ends of the circuit runs. The bond pads are patterned to form conductive ridges that extend above the underlying substrate. Next a conductive malleable metal bump is placed atop the bond pads and an adhesive is applied. After this, IC dies are placed atop respective ones of the IC bumps and compressive force is applied to the dies. Accordingly conventional adhesive may be used which does not require a low coefficient of thermal expansion.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIG. 4 is a top view of the circuit run of FIG. 2 showing a portion in phantom outline of the die to which it is bonded.

DETAILED DESCRIPTION OF THE INVENTION

Figure 1:
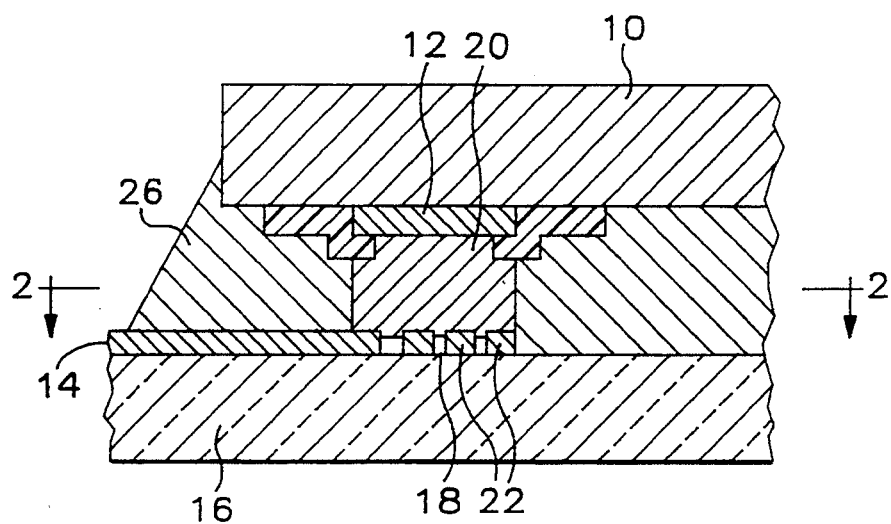
FIG. 1 is a partial cross sectional schematic view of a silicon die attached by a patterned metal interconnect to a circuit run on a substrate taken along line 1—1 of FIG. 2.
Figure 2:
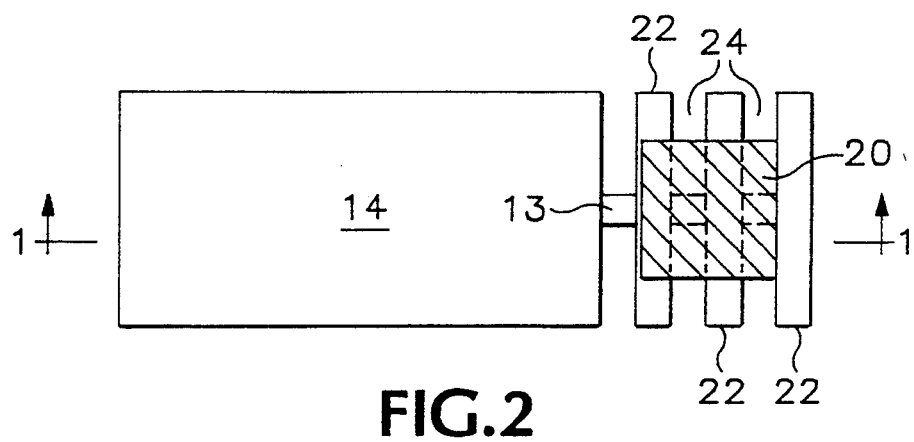
FIG. 2 is a top sectional view of a micropatterned bond pad taken along line 2—2 of FIG. 1.

A connection between the bond pad of a silicon die and a circuit run on a substrate as illustrated in FIGS. 1 and 2. A silicon die 10 includes a bond pad 12. A circuit run 14 is placed upon a substrate 16 in a predetermined position so that an end which is formed into a micropatterned bond pad 18 lies directly underneath the bond pad 12 of the silicon die 10. A bump of a highly conductive malleable metal 20 interconnects the bond pad 12 with the bond pad 18 of the circuit run 14. The bond pad 18 is patterned with a center lead 13 having cross pieces that produce ridges 22 exposing portions of the underlying substrate 16 and providing cutout areas 24 in between the ridges 22. An adhesive 26 is placed around the bump 20 as a sealant.

It will be observed that the malleable metal of the bump 20 is compressed into the cutout portions 24 between the metallic ridges 22. This interlocks the bump 20 with the bond pad 18 at the end of the circuit run 14. Thus, if the adhesive 26 expands thermally or under the effect of high moisture, the bump 20 will be prevented from pulling away from the substrate 16 and the bond pad 18 end of the circuit run.

The circuit runs may be preformed with patterned metallization at their outer ends or the circuit runs could be etched after deposit on the glass substrate to form the metallization pattern. Once the circuit runs have been placed in a predetermined pattern where the ends having the metallization patterns are configured to receive the bumped bond pads of a die, the bumps are placed atop each of the patterned ends of the circuit runs. This bump is made of a highly conductive malleable material, preferably gold, but indium or copper could also be used. The die is pre-bumped by photolithographically patterned and electroplated gold. Adhesive is then dispensed around the gold bumps at the ends of the circuit runs. Next the dies are placed atop the bumps so that their contact pads line up with the bumps at the ends of the circuit runs. A compressive force is then applied to the die which mashes the gold bumps into the cutout portions between the ridges formed by the metallization patterns. Compression also spreads the adhesive around and under the die.

FIG. 2 shows one possible metallization pattern for the circuit run 14. The gold bump 20 lies atop the metal ridges 22 and has a width that exceeds the interridge separation distance. This allows the bump 20 to be mashed down into the spaces 24 between the ridges 22. In this configuration the ridges 22 extend parallel to the edge of the die 10. Experimentally it has been found that this is the strongest configuration for the metallization pattern because expansion in the adhesive tends to force the gold bump 20 into tighter engagement along the edges of the metal ridges 22.

Figure 3A:
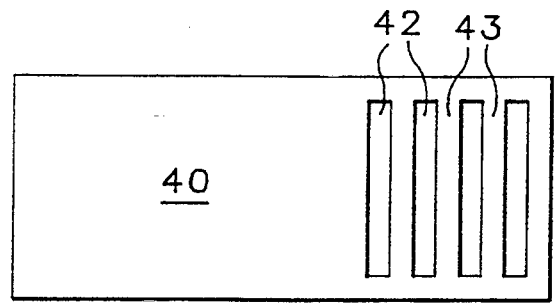
FIG. 3A is a top view of a circuit run micropatterned bond pad having a metallization pattern with rectangular cutouts.
Figure 3B:
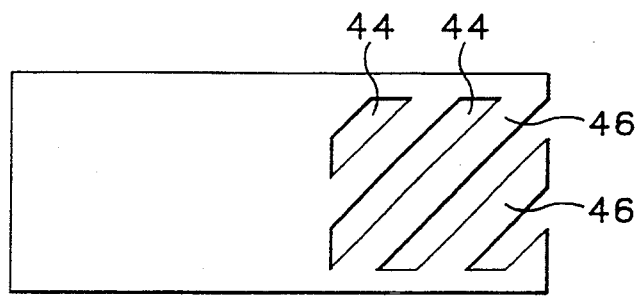
FIG. 3B is a top view of a circuit run having a micropatterned bond pad with diagonal metallization cutouts.
Figure 3C:
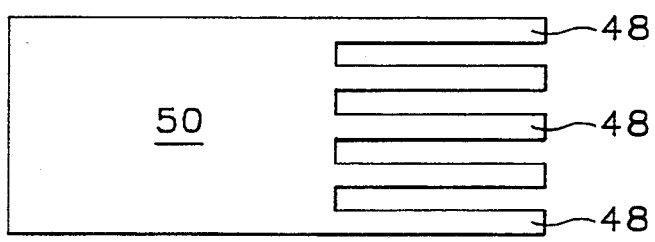
FIG. 3C is a top view of a circuit run having a micropatterned bond pad with parallel finger cutouts extending perpendicular to an edge of the IC die to be placed thereon.

If desired, however, other metallization patterns may be used which do not depart from the spirit of the invention. FIGS. 3A through 3D show a variety of metallization patterns at the ends of circuit runs. In FIG. 3A the circuit run 40 includes cutout portions 42 that expose the underlying substrate and leave a plurality of parallel extending metal ridges 43. In FIG. 3B diagonal cutouts 44 create diagonally extending ridges 46 which will be oriented at an oblique angle relative to the edge of the die to which they are attached. In FIG. 3C the metallization pattern forms a plurality of fingers 48 at the end of a circuit run 50.

Figure 3D:
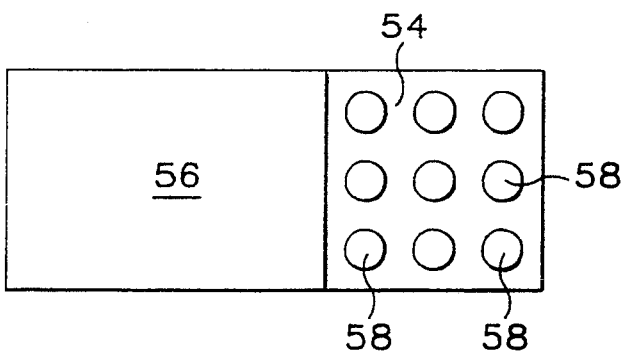
FIG. 3D is a top view of a circuit run having a micropatterned bond pad featuring a thick conductor overlaying a thin conductor where the thick conductor includes metallization islands of circular configuration extending above the thin conductor.
Figure 3E:
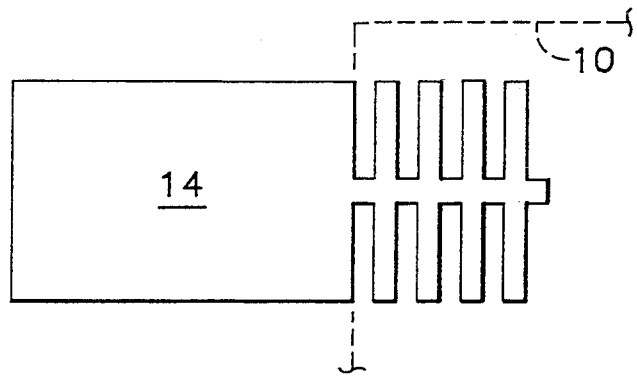

A different type of metallization pattern is shown in the embodiment of FIG. 3D. In this embodiment a thin conductor which may be indium tin oxide 54 is placed underneath a thicker conductor 56. Together this dual layer conductor forms the circuit run. The thick conductor 56 is etched away at the end of the circuit run to form circular islands 58 of the thick conductor material. The thin conductor 54 thus forms the conductive path and the islands 58 form the interlocking engagement for the gold bump to be compressed thereon. The circular or dot shape of the islands in this pattern provides resistance to movement in all directions uniformly.

By use of the metallization patterns described herein for the ends of circuit runs it is no longer necessary to critically match the coefficient of thermal expansion of any adhesive to be used with the $C_{TE}$ of the metal circuit runs or the interconnecting bump. Moreover, the differential expansion of the die and substrate tends to push the bond pads of the die radially outwardly or inwardly from the center of the die. Thus, where the rungs or the ridges of the metallization pattern extend parallel to an edge of the die (and thus perpendicular to a line extending toward the center of the die) compression will result between the gold bump and the inner edges of the ridges formed by the metallization pattern. This keeps the die tightly locked to the ends of the circuit runs despite any such relative movement of the substrate and the die.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A circuit run for an IC die comprising a metallic conductor deposited on a substrate, said run including an end portion micropatterned bond pad having a metallization pattern comprising conductive ridges and cutout areas.

2. A bond pad connection for attaching an end of a circuit run to an IC die, the circuit run deposited on a substrate and extending to a predetermined location thereon, comprising an end portion having patterned ridges extending above portions of the underlying substrate and a conductive metal bump positioned atop the patterned ridges.

3. A connection for mounting an IC die having an IC bond pad onto a substrate, comprising:
    (a) a circuit run extending across the substrate terminating in a bond pad portion, said bond pad portion including a metallization pattern forming spaced-apart raised portions on the substrate;
    (b) a conductive bump pressed into said metallization pattern to form an interlocking engagement therewith;
    (c) said IC bond pad attached to said conductive bump.

4. The connection of claim 3 wherein the conductive bump is made of gold.

5. The connection of claim 3 wherein the metallization pattern is in the form of a plurality of parallel ridges.

6. The connection of claim 3 wherein the metallization pattern is in the form of circular islands.

* * * * *